CLOCKWORK WITH TORSIONAL OR FLEXIBLE OSCILLATOR

Filed Aug. 29, 1966

1

3,433,009
CLOCKWORK WITH TORSIONAL OR FLEXIBLE OSCILLATOR

Albrecht Haag, Schwenningen am Neckar, Germany, assignor to Kienzle Uhrenfabriken G.m.b.H., Schwenningen am Neckar, Germany, a limited-liability company of Germany Filed Aug. 29, 1966, Ser. No. 575,855
Claims priority, application Germany, Aug. 28, 1965, K 56,990, K 56,991
U.S. Cl. 58—23 9 Claims
Int. Cl. G04c 3/00

ABSTRACT OF THE DISCLOSURE

A clockwork powered by a vibratory piezoelectric element subjected to an oscillating potential difference, and mechanically connected to a mechanical stabilizing oscillator. Means are provided to convert vibratory motion to intermittent rotary motion.

The present invention relates to a timepiece having a torsional or flexual oscillator as the device for fixing the timekeeping cycles of the timepiece.

For timepieces which are to meet high requirements of precision, tuning forks, leaf springs, torsion bars and similar elements, for example, are used as torsional or flexual oscillators for running rate control. The control and conversion of energy to operate such a mechanical oscillator, is obtained without the use of contacting parts by means of electronic switching to convert electrical energy to mechanical energy. In such timepieces the mechanical oscillator is associated with a permanent magnet system which acts upon the input winding of an electronic switching device. These input signals from the winding are amplified and sent on to a work or drive winding whose magnetic field induces actuation of the vibrator or oscillator. The drive of the hand or pointer works can be taken off directly from the mechanical oscillator, for example in the case of a tuning fork, one of its tines may drive a pawl to operate a stepping wheel, or via an especially designed electrical stepping switch-work actuated in timed relationship with the cycle of the oscillator.

These known devices have several inherent drawbacks. The electronic switching is employed for maintaining the oscillation of the mechanical oscillator. The permanent magnet on the oscillator does not permit of being arranged for as good timekeeping as is possible. This is owing to the fact that the drive for the work train via direct mechanical coupling between the oscillator and the hand works presents such extraordinary difficulties in designing and arranging a take-off element that unfavorable action always disturbs the intended isochronic behavior of the mechanical oscillator. As an alternative, the drive of the pointer work is accomplished by a special electromechanical transducer so that the disturbance of the isochronic properties of the oscillator is eliminated, but this advantage requires high dissipation of energy as well as inherently increased cost of the timepiece since such transducers are of complicated construction and function, and they increase the size of the timepiece besides.

Piezoelectric elements have already been used to replace the signal-producing coil and its associated permanent magnet system for an electronic switch and such elements have been mechanically coupled to the oscillator. The element develops a potential synchronized with the frequency of oscillation and so controls the output from the switch or relay. In those constructions a piezoelectric element serves only to control the electronic switch and no other function.

2

It is also known to form the mechanical oscillator itself as a piezoelectric element. Such elements are developed as blade springs or tuning fork oscillators. The working frequency of these systems is indeed quite high, mostly far above a kilocycle per second so that electrical frequency reducers must be employed to reduce the frequency low enough so that mechanical drive for the hand or pointer works is possible. Besides, the piezoelectric oscillators are costly since their form is restricted to the oscillator frequency.

An object of the present invention is to overcome the above mentioned objections, especially in vibrator and torsion balance oscillators to provide by very simple means, the maintenance of oscillation of the oscillator, and when necessary, also serve as a drive for the hand or pointer works.

This objective is attained in an electrically driven timepiece having an associated electronic switching means with a piezoelectric element electrically connected into the signal circuit for the switch and mechanically coupled with an oscillator. The piezoelectric element is also in feed-back from the output circuit of the switch so that the load also drives the oscillator. The element can at the same time carry the stepping means for a stepping or progression of the pointer works. The piezoelectric element is preferably made up of a flexual or bending oscillator having one end clamped, and the oscillator is coupled to the mechanical vibrator at a suitable distance from the fixed mounting point of the latter and carries the stepping means on its free end. The amplitude of the piezoelectric element should be independent of the operating voltage and this can be obtained by electrical stabilizing means, or by mechanical amplitude or progressively acting countersprings, or in the form of dampening means such as dashpots. A piezoelectric element as the bending oscillator can also be mounted at its middle and be coupled at one end to the mechanical vibrator and at the other end carry the stepping means for the stepping for the pointer works. The mechanical coupling between the element and the mechanical vibrator is preferably in the neighborhood of a resulting mode of oscillation of the latter. The entire arrangement can also be made symmetrical so that two symmetrically working elements actuate the vibrator and in this construction the mount for the ceramic elements carries the entire mechanical oscillatory system since these elements are mechanically connected to the vibrator or mechanical oscillator.

The piezoelectric ceramic elements are preferably of barium titanate, or barium zirconium titanate, as these materials exhibit a very high efficiency for converting electrical to mechanical energy. In the form of flexual or bending vibrators, the amplitude of oscillation of such material reaches much as a millimeter. In this invention the piezoceramic elements perform a multiple function for they are the input element in the electronic switch, and secondly, they are the load in the output of the switch and consequently the drivers for the mechanical oscillator. Hence the influencing of speed of the mechanical oscillatory system owing to continuous stepping is eliminated. Since the coupling between the ceramic element and the mechanical vibrator can be located in the vicinity of a nodal point of a node of vibration the timekeeping properties of the system can be considerably more precise than those afforded for the hitherto known systems. There is no need for complicated electromagnetic mechanical converters since the piezoelectric element serves the function. The feeding or stepping element may be such as a ratchet, shift spring, or verge, or a tuned magnetic device.

If the electrical switch system is of a nature that is especially adapted to high frequency and greater accuracy is desired, a high frequency electrical oscillator may be employed, which does not include the same piezoelectric element in the input and output of the electronic switch. For example, if a quartz crystal is to control the frequency of the oscillator frequency and the quartz crystal is to oscillate much above about 500 c.p.s. the usual stepping ratchets cannot operate at such frequencies or speeds. This still does not prevent the use of high frequency current as a source of power to be used indirectly to excite a ceramic piezoelectric drive element. A frequency reducer between the high frequency oscillator and the piezoelectric element can be interposed to bring the working or load circuit down to more reasonable frequencies of the order of 1, 5 or 50 c.p.s. and still allow the electrical control oscillator to operate at high frequency.

Figure 1:
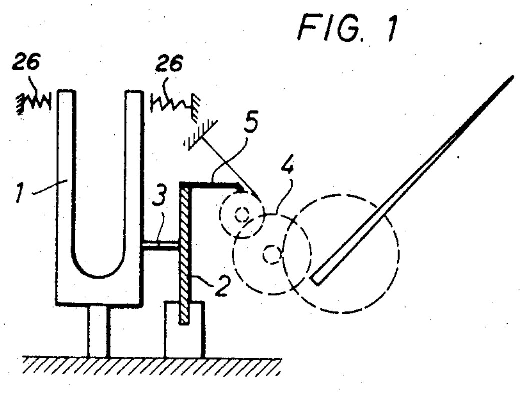
FIG. 1 shows a tuning fork oscillator with one piezoelectric ceramic element.

The device of FIG. 1 includes a tuning fork 1 mounted for vibration and mechanically connected by suitable means 3, such as a small rod or wire to a piezoelectric element 2 mounted at a marginal edge portion and having an opposite vibratory edge portion. The vibratory edge portion carries a ratchet member 5 for intermittently advancing a train or gears 4 driving a pointer or hand of a timepiece as the ratchet is reciprocated by the piezoelectric element. Brake or stopping pawl means may be provided to prevent undue backward motion of the train as the ratchet is retracted after each driving stroke. The construction of the train is similar to that of 18 in FIG. 7 wherein the stepping wheel is shown at 16 and the pawl means at 17.

Figure 6:
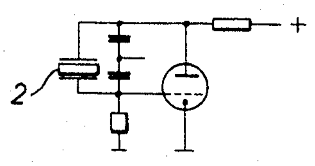
FIG. 6 shows the piezoelectric element in the switching means or oscillatory electric generator.

Sustained vibration oscillation of the piezoelectric element 2 is attained by connecting it into the control circuit with feedback from the load circuit of a conventional electrical oscillatory circuit as shown in FIG. 6. In the circuit of FIG. 6 it is to be noted that by having the piezoelectric element in the grid feedback as well as in the output or load, an electronic regenerative electrical oscillatory or switching circuit is produced. The piezoelectric element 2 may be of ceramic material such as barium or barium zirconium titanate as the dielectric of a capacitor in the input or control circuit to stabilize the electrical frequency.

Excessive amplitude may be prevented by stops or buffers, such as countersprings 26 against which there is increasing reaction due to greater compression of the spring as the amplitude of vibration increases, so that they function as progressively acting buffer springs.

Figure 2:
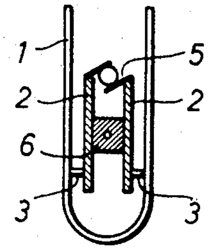
FIG. 2 shows a tuning fork with two piezoelectric elements.

Two elements such as the element 2 may be employed and mounted at their midportions on opposite sides of a square mounting block 6 as shown in FIG. 2. Opposite marginal portions of the respective elements are mechanically coupled by the two means 3 to the respective tines of the fork in the general vicinity of yoke of the fork, while the two elements' marginal portions, most remote from the yoke carry inwardly directed ratchet members to engage a stepping wheel of the pointer works. In this construction the fork substantially embraces the mounting block 6, the piezoelectric elements, the coupling means and the ratchet members, and has no independent mount of its own, being supported indirectly by the mount 6, and so needs no shank for mounting. Except for the ratchet members, the system of FIG. 1 is symmetrical with respect to the longitudinal axis of the tuning fork.

Figure 3:
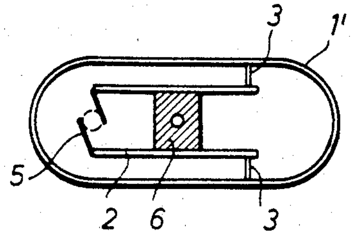
FIGS. 3 and 4 show an endless or oval shaped vibrator with the piezoelectric elements.

The mechanical oscillator may be therefore, in the form of an endless oval shaped spring 1' in FIG. 3 formed in a manner analogous to the joining of the ends of the fork 1. Here, too, the block 6 is a mount for the whole system.

Figure 4:
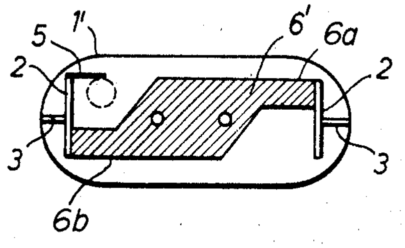

The system of FIG. 4 employs the oval spring of FIG. 3 but the mount 6' is of such shape that two piezoelectric elements are mounted much as in FIG. 1, but on opposite offset ends **6*a* and 6*b* of mount 6 and the coupling means 3 are connected to ends of the oval and lie on or about on its major axis. Only one pawl member 5** is employed and it is mounted on only one of the piezoelectric elements.

Figure 5:
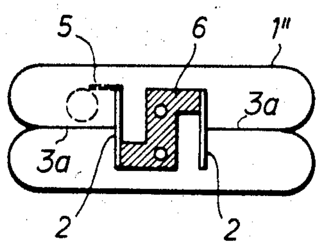
FIG. 5 shows a double oval vibrator similar to that in FIG. 4.

In FIG. 5 the action is essentially the same as in FIG. 4 and the construction differs essentially only in that the oscillatory spring 1' 'is a somewhat double oval shaped spring having common inner portions **3*a* functioning both as spring portions and as coupling means similar to those of 3 in FIG. 4. The length of the mount is less in FIG. 5 to enable the spring portion 3*a* to be relatively longer than the coupling means 3** in FIG. 4.

Figure 7:
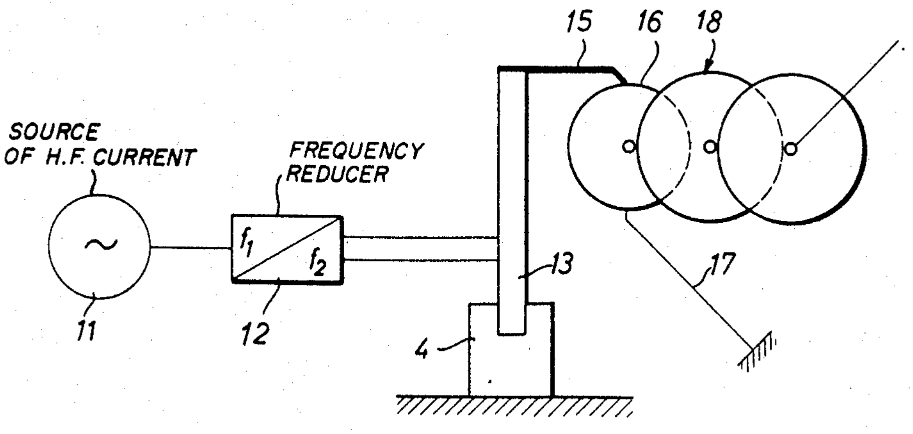
FIG. 7 shows a vibratory device having an electrical oscillator of high frequency for control of the drive means.

The form of the invention shown in FIG. 7 shows an electrical oscillator 11 which functions basically as does the tuning fork 1 of FIG. 1. High frequency electrical oscillators can be produced by known methods with extremely high accuracy by employing quartz crystals to determine the frequency of the oscillatory circuit. Moreover when such circuits contain transistors their energy requirement are extremely low. Such an oscillatory circuit is shown as the component 11 having a frequency $f_1$ and whose signals are reduced by a frequency reducer 12 to a frequency $f_2$ on the order of 1, 5 or 50 c.p.s. The piezoelectric element 13, similar to element 2 in FIG. 1, is then energized at the frequency $f_2$ to vibrate and reciprocate the ratchet 15 to advance the stepping wheel 16 of a clockworks train 18. Backward movement of the wheel 16 is prevented by pawl member 17. Of course the output $f_2$ could be used to drive a synchronous motor instead of the stepping wheel 16.

The frequency reducer may be of any known type.

The present invention, by its use of electronic switching means which requires very little current, as opposed to contact switching means generally resulting in arcing and frictional loss at the contacts, enables the use of small battery as the source of current.

The tuning fork 1, the oval spring 1' and the double oval spring 1'' are all mechanically deformable elastic members.

What is claimed is:

1. An electrically driven clockwork wherein switching means free from make and break contacts for the application of current for driving the works are employed, said clockwork comprising a stabilizing oscillator, an electronic regenerative electrical switching circuit having feed-back, a piezoelectric element mounted for oscillation and electrically connected into the output and feed-back of the circuit, and means for coupling said element to the stabilizing oscillator so that the output from the switching circuit drives the piezoelectric element which in turn drives the oscillator, said oscillator being in the form of a mechanically elastic member.

2. A clockwork as claimed in claim 1 said clockwork including a driven wheel and said element being in the form of a flexual vibratory member having a portion fixedly mounted, and in a zone near the mounted portion but spaced therefrom, the member being mechanically coupled to the oscillator, the member having a free vibratory end, and means for driving the driven wheel on said free end.

3. A clockwork as claimed in claim 1 and including a driven wheel, and means carried on the piezoelectric element for advancing the driven wheel.

4. A clockwork as claimed in claim 2 and means for restricting the amplitude of vibration of the vibratory member.

5. A clockwork as claimed in claim 4, said means for restricting the amplitude being progressively acting buffer springs.

6. A clockwork as claimed in claim 2, said driven wheel being a stepping wheel and said portion fixedly mounted being the mid portion of the member, and having a ratchet member as said means for driving the driven wheel, and the other end portion of the member being said zone of coupling to the oscillator.

7. A clockwork as claimed in claim 2, the piezoelectric element being coupled to the oscillator near a nodal point of the oscillator.

8. An electrically driven clockwork wherein switching means free from make and break contacts for the application of current for driving the works are employed, said clockwork comprising a stabilizing oscillator, an electronic regenerative electrical switching circuit having feed-back, a piezoelectric element mounted for oscillation and electrically connected into the output and feed-back of the circuit, means for coupling said element to the stabilizing oscillator so that the output from the switching circuit drives the piezoelectric element which in turn drives the oscillator, a second piezoelectric element symmetrically arranged with respect to the oscillator and the first mentioned element for symmetrical action on the oscillator, and a second coupling means between the element and oscillator.

9. A clockwork as claimed in claim 8, two of said coupling means being a mount for the oscillator on the element.

References Cited

UNITED STATES PATENTS

| | | | |
|---|---|---|---|
| 2,570,436 | 10/1951 | Eberhard et al. | 58—23 |
| 2,759,102 | 8/1956 | Bruns | 58—23 |
| 3,176,167 | 3/1965 | Vosselee | 58—23 |

RICHARD B. WILKINSON, *Primary Examiner.*

E. C. SIMMONS, *Assistant Examiner.*

U.S. Cl. X.R.

315—218; 331—112